(12) United States Patent
Vukovic

(10) Patent No.: US 7,591,232 B2
(45) Date of Patent: Sep. 22, 2009

(54) INTERNAL COIL WITH SEGMENTED SHIELD AND INDUCTIVELY-COUPLED PLASMA SOURCE AND PROCESSING SYSTEM THEREWITH

(75) Inventor: Mirko Vukovic, Slingerlands, NY (US)

(73) Assignee: Tokyo Electron Limited, Tokyo (JP)

( * ) Notice: Subject to any disclaimer, the term of this patent is extended or adjusted under 35 U.S.C. 154(b) by 354 days.

(21) Appl. No.: 11/278,167

(22) Filed: Mar. 31, 2006

(65) Prior Publication Data

US 2007/0235327 A1   Oct. 11, 2007

(51) Int. Cl.
*C23C 16/00*   (2006.01)
*C23F 1/00*    (2006.01)
*H01L 21/306*  (2006.01)

(52) U.S. Cl. .............................. 118/723 I; 156/345.48
(58) Field of Classification Search ............... 118/723 I; 156/345.48

See application file for complete search history.

(56) References Cited

U.S. PATENT DOCUMENTS 5,231,334 A * 7/1993 Paranjpe ............... 315/111.21
5,560,776 A * 10/1996 Sugai et al. ........... 118/723 AN
5,580,385 A * 12/1996 Paranjpe et al. ........... 118/723 I
5,587,226 A * 12/1996 Leung et al. ................ 428/210
5,763,851 A * 6/1998 Forster et al. .......... 219/121.43
6,080,287 A    6/2000 Drewery et al.
6,346,915 B1 * 2/2002 Okumura et al. ............ 343/701
2006/0081185 A1* 4/2006 Mauck et al. ............. 118/723 I

* cited by examiner

*Primary Examiner*—Parviz Hassanzadeh
*Assistant Examiner*—Rakesh K Dhingra
(74) *Attorney, Agent, or Firm*—Wood, Herron & Evans, L.L.P.

(57) ABSTRACT

An RF antenna assembly is provided having a segmented, conductive, deposition baffle covering an antenna conductor designed for operation internal to a vacuum processing chamber in presence of metal vapor or ions. The antenna can be placed either above the wafer, or around it. The baffle includes two concentric layers of segmented shields. The inner segmented shield is a dielectric, and the outer segment shield is electrically conductive. The segments are preferably staggered and the dielectric layer is configured to occupy the space and maintain the distance between the conductor and the outer shield. The shield segments arranged end-to-end, with non-conductive, endless, circumferential gaps between the segments of the conductive outer layer.

17 Claims, 5 Drawing Sheets

INTERNAL COIL WITH SEGMENTED SHIELD AND INDUCTIVELY-COUPLED PLASMA SOURCE AND PROCESSING SYSTEM THEREWITH

This invention relates to high-density plasma generating devices, systems and processes for the manufacture of semiconductor wafers. In particular, the invention relates to antenna and source structure for producing high-density inductively coupled plasmas (ICP) for such systems and processes.

BACKGROUND OF THE INVENTION

In the physical metal deposition step of wafer processing, increased plasma density improves the performance of the processing tool and extends the technology to the processing of wafers with finer features. Typically, a dense plasma is inductively generated with an antenna, either internal or external to the processing volume. The increased plasma density results in increased fractional ionization of metal atoms, sputtered from a sputtering target having a sputtering surface in the processing volume, for deposition onto a substrate wafer being processed in the volume. This, combined with RF bias on the wafer leads to improved coverage of the features on the wafer surface and reduces their closing-off. Likewise, during a separate stage of the Ionized Physical Vapor Deposition (IPVD) process, the soft-etch stage, an auxiliary plasma source is necessary to provide a uniform and dense plasma at the wafer level, so as to enable a uniform etch at an acceptable rate, but at a reduced DC bias voltage level. The plasma uniformity and low bias voltage are necessary to eliminate plasma damage. Finally, during the pre-clean stage of wafer processing, it is again desirable to perform a wafer soft-etch. As in the case of the soft-etch process, plasma density and uniformity are critical for process throughput and avoiding plasma damage.

One example of a prior art to IPVD uses an RF antenna mounted inside the process volume and operated at a frequency of 450 kHz so as to reduce the RF voltages on the antenna. A disadvantage of this approach has been that the RF antenna is consumable in that, due to the large RF voltages of at least several hundred Volts that develop on the antenna, plasma sputters material from the antenna, eventually necessitating the replacement of the antenna.

Another disadvantage of the internal antenna approach has been that antenna cooling has been required, which complicates and the operation of the processing module. For example, to prevent overheating of the antenna from the plasma heat load, the antenna has had to be water-cooled. During operation, care has had to be taken not to punch through to the water-cooling channel, either by sputtering through the walls or burning through by arcing.

An alternate prior art approach to the internal antenna in IPVD is that adopted by Drewery et al. in U.S. Pat. No. 6,080,287. In this approach, the RF antenna is external to the processing chamber, and is situated in air, with the PF field from the antenna penetrating into the chamber through a dielectric window. To preserve the transparency of the dielectric window to the RF, the window is shielded from metal ions in the plasma in a manner that would still provide RF transparency by the introduction of a deposition shield. The shield is designed in a manner to be opaque to most of the metal ions but transparent to RF. As discussed by Drewery et al., this is accomplished by introducing a shield of electrically conductive material with long slots generally perpendicular to the direction of the RF antenna segments. The slot cross-section is designed to block the vast majority of metal flux, while permitting the passage of RF flux. This approach removes many of the problems of the internal antenna design.

Used with an external antenna, the deposition shield must accomplish two counteracting goals: RF transparency and opacity to metal transport. These goals are not easily accomplished, as one is usually achieved at the expense of the other. The deposition shield is either made of one piece with a complex slot shape (a slot of chevron shaped cross-section is one such example) or a two-piece assembly with overlapping slats must be produced. The single shield has a higher RF transparency but is more complex to manufacture. The two-piece assembly is simpler to manufacture but has a lower RF transparency.

An external antenna coupling RF energy through a shield typically must produce high RF currents. Depending on the shield design, to the extent RF transparency is reduced, antenna current, and thus voltage on the antenna, must be larger. Larger antenna current and voltage in turn leads to increased complexity of other parts of the RF circuit directly connected to the antenna, namely the tuning network and the RF connectors from the antenna to the tuning network. Further, since the antenna is positioned in air, the space surrounding the antenna is filled with RF flux, which is in essence unused flux, as it does not contribute to plasma generation. This comes at a price of increased antenna inductance, and thus increased antenna voltage.

The deposition shield must usually also be water-cooled to reduce its thermal cycling and particle shedding. In practice this may mean that a water connection is made in vacuum between the water feeds and the shield. While this is certainly feasible, it poses the risk of a water leak in the process module.

Further, for some applications, it is preferable to have the antenna positioned or wound around a cylindrical dielectric window or even around a frusto-conical dielectric window. Deposition shields for those applications are respectively cylindrical or conical. The machining of slots in such shields is very complex. This applies to soft-etch and pre-clean applications as well as deposition. However, these applications are usually performed at lower RF power and also at lower pressures. Under these conditions, design and manufacture of a deposition shield is simpler than for IPVD.

Accordingly, there is a need for the generation of dense and uniform plasma in the process volume with an antenna positioned inside the process volume.

SUMMARY OF THE INVENTION

The present invention provides for the generation of a dense and uniform plasma in the process volume with an antenna positioned inside the process volume that overcomes many of the problems discussed above.

According to principles of the present invention, an internal antenna is provided for ICP processing by surrounding an RF conductor with a segmented protective baffle made of an electrically conducting material. The segments of the baffle protect the RF conductor from plasma sputtering and heat load but allow for superior transmission of RF flux into the plasma. The antenna, or several of them, can be positioned at various locations inside the processing volume to insure a uniform and dense plasma.

According to certain principles of the present invention, a plasma source is provided with an antenna formed of an RF conductor that is enclosed by two concentric layers of segmented shields. The first segmented shield is an inner shield formed of a dielectric, while the second segmented shield is an outer shield formed of a material that is electrically conductive. The dielectric shield serves to distance the RF conductor from the conductive shield, maintaining separation and occupying space between successive segments of the conductive shield. Thus the inner shield may be referred to as a "spacer" and the outer shield may be referred to as a "plasma shield" or simply a "shield". The assembly that includes the RF conductor, the spacer and the shield is referred to as the "plasma source" or "source".

According to certain embodiments of the invention, a plasma processing apparatus is provided having a vacuum chamber with a plasma source that includes the antenna having the spacer and segmented shield located within the vacuum processing space. The antenna is mounted within the processing space and connected to an RF energy source in such a way that the RF electrical conductor circuit is physically isolated from the plasma. The RF energy source is located outside of the chamber and is connected by leads that feed through insulators in a chamber wall to opposite ends of the antenna conductor, with the leads within the processing space and conductor physically isolated from the processing space that will contain a plasma.

The plasma shield is designed to withstand high temperatures and to absorb most of the plasma heat load. This eliminates the need to actively cool the conductor. Cooling gas may be used to cool the conductor, in which case the cooling gas should be the same as the process gas or inert component thereof so as to prevent the module contamination in case of a leak.

A source according to the present invention can be provided in several different configurations and in various locations in the chamber. While a single-turn antenna is generally described, most aspects of the present invention can be extended to multiple turn antennae.

Advantages of the invention over the prior art are in part the result of the antenna conductor being embedded in the plasma but still protected from the plasma flux. The advantages include shield simplicity, in part because the shield is not above the wafer and does not require active cooling, and superior RF transparency of the shield.

Further, while RF transparency of a standard deposition baffle is reduced by slot end effects, where the slot ends short out the current flux going into the chamber, such slot end effects can be reduced only somewhat by extending the slots beyond the extent of the coils. With the present invention there are no slot ends, because with the segmented shield, slots are circumferential and have no ends, so there is no shorting effect.

Antenna simplicity is provided with certain embodiments of the present invention by the provision of gas cooling instead of water cooling for antennae immersed in the plasma. This simplifies the antenna construction and connections, and confines the possibility of accident to nothing more than a small gas leak. Further, since the antenna is enclosed in a plasma, the coupling efficiency is high and the parasitic inductance due to magnetic flux filling non-plasma space is minimized to the inductance between the conductor and the shield.

These and other objectives and advantages of the present invention will be more readily apparent from the following detailed description.

DETAILED DESCRIPTION

According to principles of the present invention, a plasma source is provided with an RF conductor enclosed by two concentric layers of segmented shields. In the first and inner layer, the segmented shield is a dielectric, and in the second and outer layer, the segmented shield is electrically conductive. The dielectric shield serves to distance the RF conductor from the conductive shield and maintains separation between successive segments of the conductive shield and functions as a spacer. The conductor and shields form an antenna assembly consisting of the RF conductor, the spacer and an outer conductive shield.

Figure 1:
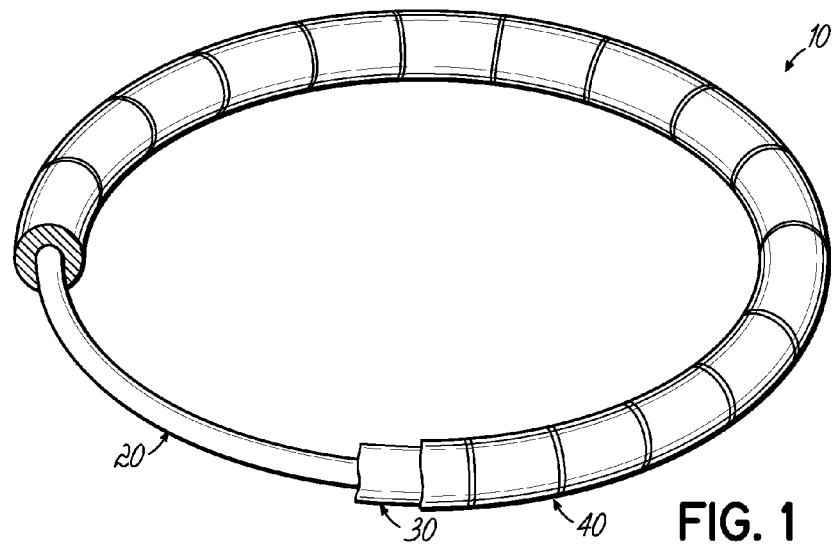
FIG. 1 is a perspective view of an antenna, according to principles of the present invention, with a cut-away exposing the conductor, the spacers, and the plasma shield.
Figure 2:
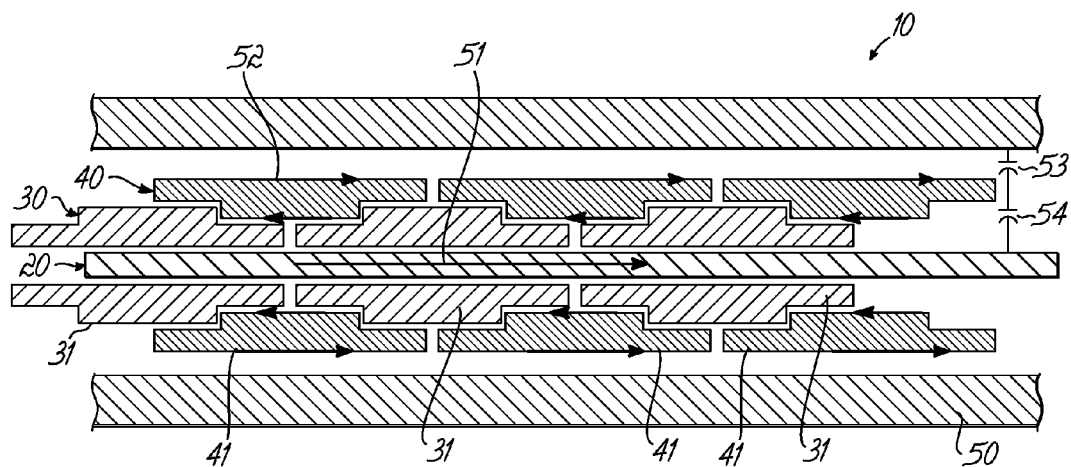
FIG. 2 is a side view of the conductor, the segmented spacers and the shield of FIG. 1, also showing schematically the capacitive coupling between the conductor and the plasma shield, and the shield and the plasma, with the RF current flow and the surface currents on the shield segments indicated by arrows.

FIG. 1 shows a perspective view of an antenna assembly 10 that includes a single turn antenna conductor 20. The conductor 20 is enclosed within a spacer 30, which is segmented. The segments of the spacer 30 are enclosed within a segmented conductive metallic plasma shield 40, A side-view of a short section of the antenna assembly 10 is shown in FIG. 2, which depicts the segments 31 of the spacer 30 and the segments 41 of the shield 40, and showing that the spacer and the shield segments 31,41 are staggered with respect to each other. RF current flow on the center conductor 20 and the shield 40 as illustrated by the arrows 51 and 52, respectively. The plasma is shown by the areas 50. The capacitance of the shield 40 to the plasma 50, represented by capacitor 53, is much larger than the capacitance 54 of the shield 40 to the RF conductor 20. The shield 40 is thus RF grounded to the plasma 50 and acquire little DC bias except for plasma floating potential. Since the floating potential of the plasma 50 is of the order of 15 Volts, the shield 40 should experience little sputtering. The conductor 20 and the shields 40 are dimensioned to prevent the ignition of parasitic discharges around the conductor 20 and in the various gaps between the spacers 31. The plasma shield 40 is designed to withstand high temperatures and to absorb most of the plasma heat load. This eliminates the need to actively cool the conductor 20.

Figure 3:
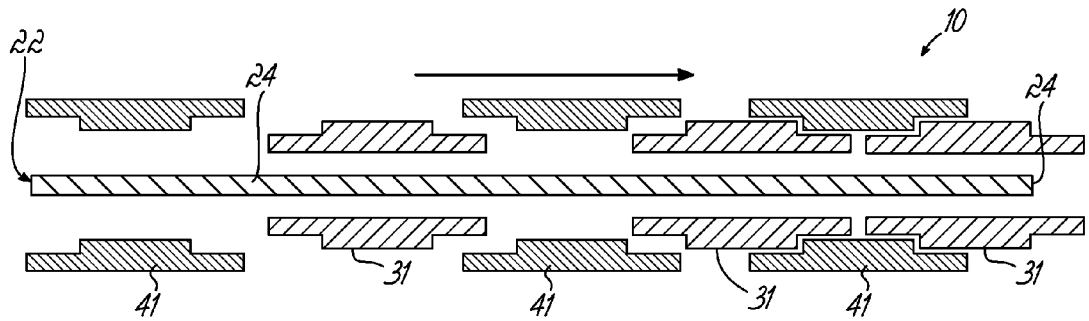
FIG. 3 is a schematic diagram representing an assembly process for the antenna of FIG. 1.

The process of assembling the antenna assembly 10 is depicted in FIG. 3. It proceeds from one end 22 of the conductor 20 by sliding alternating spacer segments 31 and shield segments 41 onto the end 22 of the conductor 20 toward the other end 24 of the conductor 20. Alternatively, segments 31 and 41 can be assembled from either or both ends of the conductor 20. The segments 31 and 41 are generally cylindrical, but can have an axis somewhat curved to accommodate the curvature of the conductor 20, having a generally circular cross-section.

Figure 4:
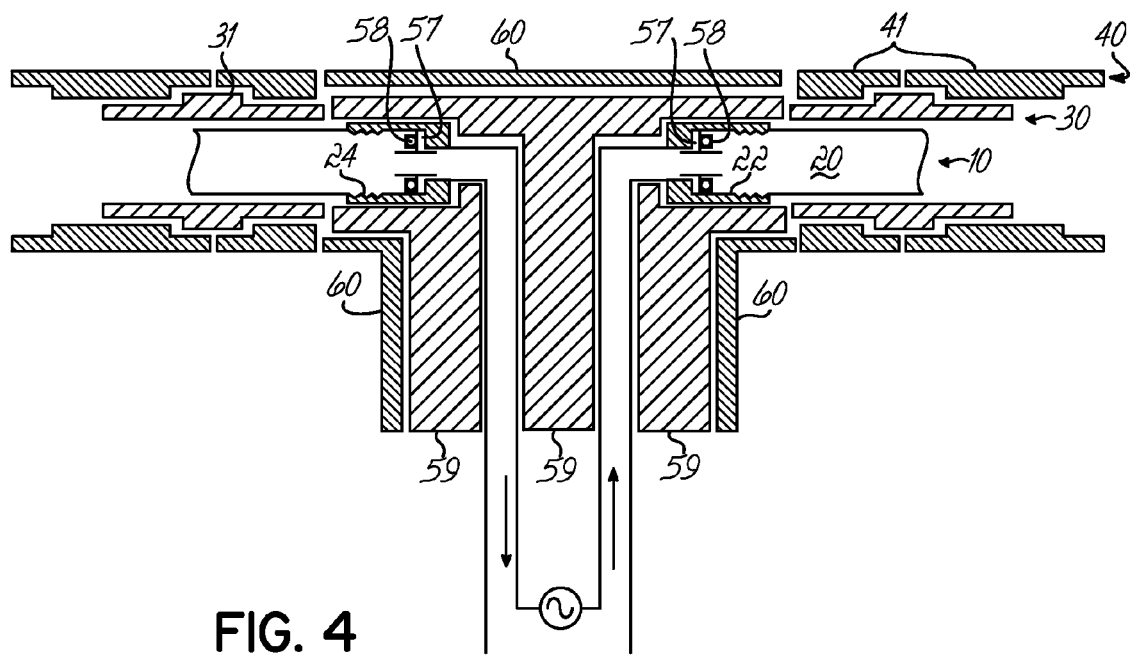
FIG. 4 is a cross-sectional view depicting a connection of the RF feed and cooling gas to the RF conductor of the antenna of FIG. 1 with the RF-hot elements of the connection shielded from the plasma by enclosing the connection in a dielectric shield and a grounded enclosure.

The conductor 20 is connected to RF-feed and gas flow lines 57 in a manner depicted in FIG. 4. This connection is made after all the spacer and shield segments 31,41 have been assembled. A vacuum seal 58 between the feed 57 and the conductor 20 is either preferably a metallic gasket or an O-ring. The RF hot elements of the connection are enclosed in a two piece dielectric shield 59, which itself is enclosed in a grounded enclosure 60. For example, the dielectric shield 59 and the grounded enclosure 60 may be combined and may be made in a two-piece clam-type design. The spacer 30 may also be a two piece shield for assembled by being closed around the conductor 20, and can close around the entire conductor assembly that includes the conductor 20 and the electrical and gas flow line connectors. Alternatively, after the feed 57 is connected to the conductor 20, the two-piece dielectric shield 59 may be placed around them with the grounded enclosure 60 following. The outer metallic shield 40 also may be made in a two-part clam shell style, and can be made as part of an assembly with the a clam shell dielectric shield 30 to be assembled on the conductor 20 together. In this example, semi-cylindrical conductive shield segments would be fixed to the dielectric material to establish the gaps.

Figure 5:
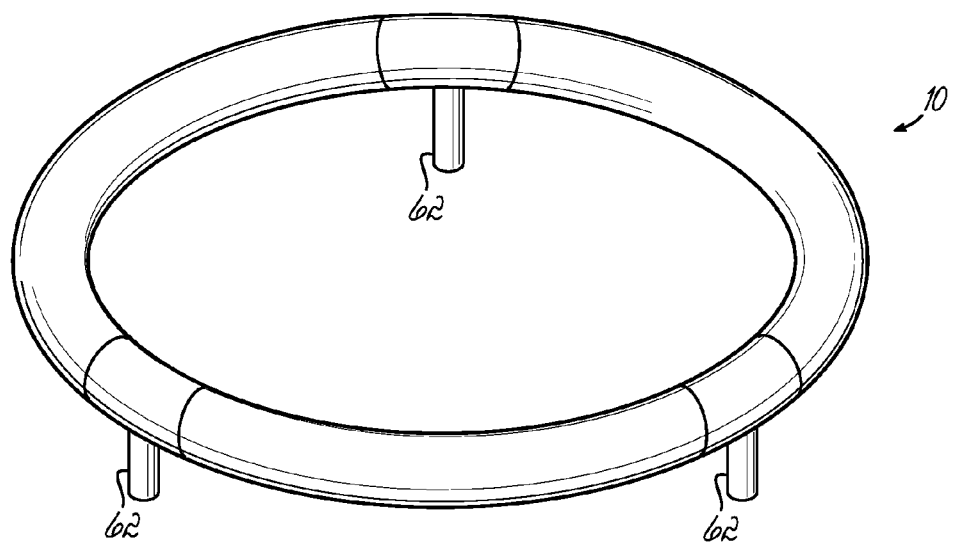
FIG. 5 is a perspective view of the antenna of FIG. 1 showing an example of the antenna assembly supports.

FIG. 4 shows the two ends 22,24 of the conductor 20 driven symmetrically. It is also possible to drive only one conductor end, and for the other to be grounded. The antenna assembly 10 is supported in a chamber by conductive supports 62, which have one end thereof connected to a chamber wall or shield (not shown), and at the other end to the antenna plasma shield 40. FIG. 5 shows the antenna assembly supported by three vertical supports 62. The number of supports can vary, and they need not be vertical. In addition to the supports 62, the antenna assembly 10 can also be supported in part by the RF and cooling gas feed 57.

The surface of the shield 40 should be roughed and possibly coated to promote metal adhesion, since these surfaces will suffer some metal deposition. Some of the spacer surfaces may also become coated with metal during deposition. To promote adhesion, they also may be pre-coated with metal. To prevent the ignition of parasitic discharges between spaces inside the antenna assembly 10, all spaces may be maintained below a critical dimension, typically 2 mm or less, which can be higher for operation at low pressures such as 10 mTorr and below.

Given sufficient gas flow to remove whatever heat may accumulate, the cross section of the RF conductor 20 is primarily dictated by manufacturing considerations. Typically, a ¼ inch or a ⅓ inch diameter will suffice. To reduce RF dissipation, the surface of the conductor 20 can be silver plated. Cooling gas, if circulated within the conductor 20, should be the same as the process gas so as to prevent the module contamination in case of a leak. While the center conductor 20 is expected to remain cold, the plasma shield segments 41 can reach elevated temperatures, not because of the large thermal load, but because the segments 41 are not thermally grounded. In principal this should not be a problem. Nonetheless, the segments may be made of non-magnetic materials that can withstand elevated temperatures, such as stainless steel, titanium, and others. The choice of material is largely influenced by the processing requirements of the chamber.

Interior surfaces of the spacer segments 31 can be coated with a high conductance coating, still compatible with the processing requirements. This will not reduce the segment temperature much, but will increase the fraction of RF power dissipated in the plasma.

Figure 6:
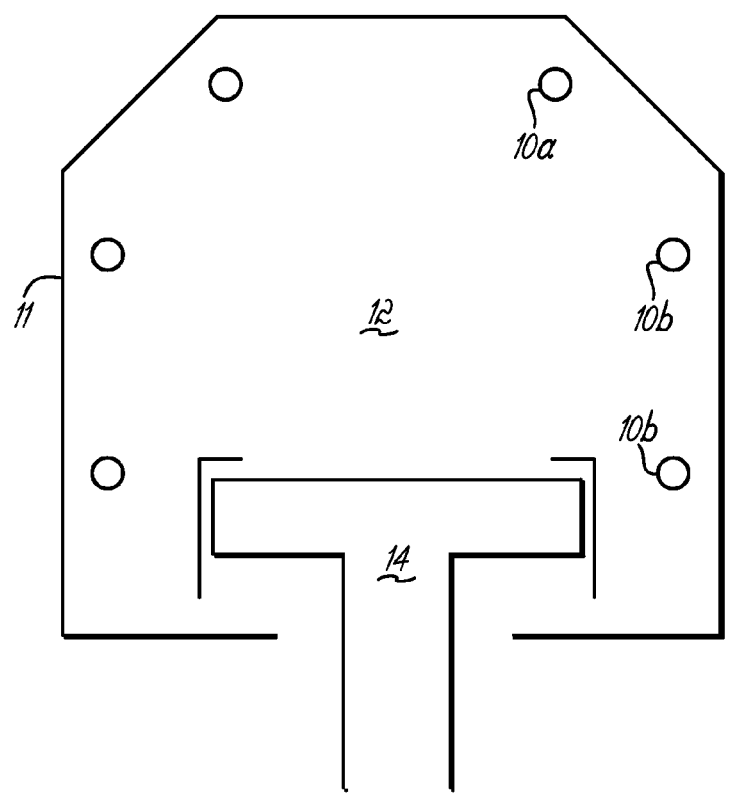
FIG. 6 is a schematic cross-sectional view of a processing module showing possible antenna locations in the vacuum chamber thereof.
Figure 7:
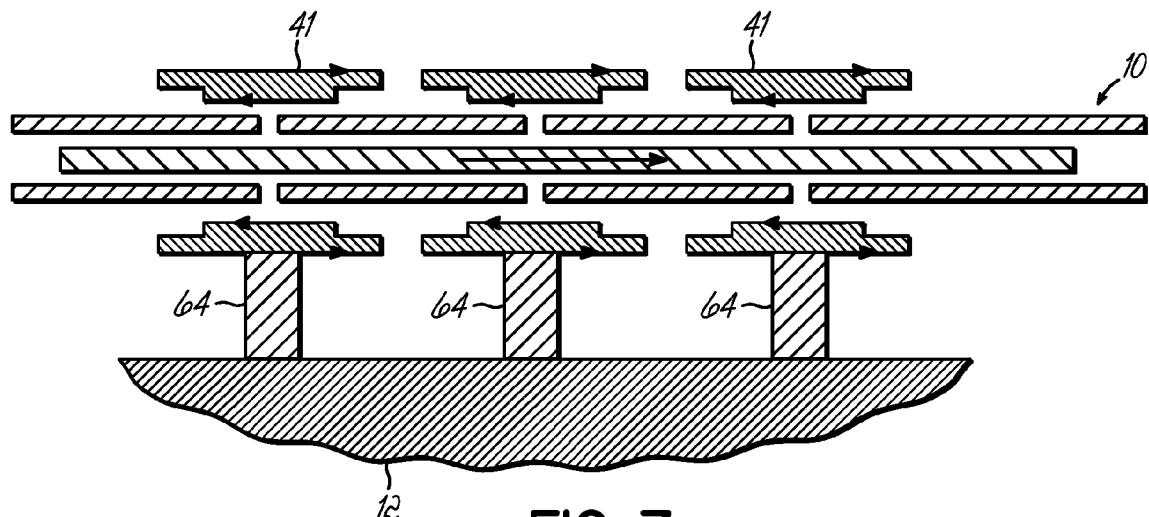
FIG. 7 is a cross-sectional view of a shield assembly showing a configuration with grounded shields.

The antenna assembly 20, according to the present invention, can be provided in several different configurations. For example, the antenna assembly 10 can be positioned in various locations in the chamber. FIG. 6 shows the antenna assembly 10 at the top of a chamber 12 within a chamber wall 11, or at mid-level therein, or around a wafer support 14 within the chamber 12, as represented by the three alternative locations 10a, 10b and 10c. Under some circumstances, it may be desirable to ground the shield segments 41, as illustrated by ground connections 64 in the embodiment shown on FIG. 7.

Figure 8:
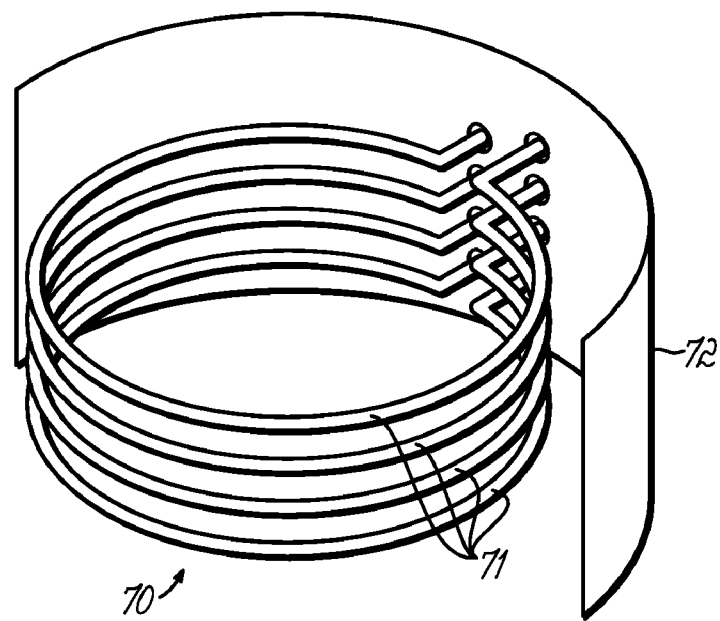
FIG. 8 is a perspective view of an antenna assembly according to an embodiment of the invention mounted in a chamber and that includes several antennae connected in series, with the serial connection behind the chamber shield.
Figure 9:
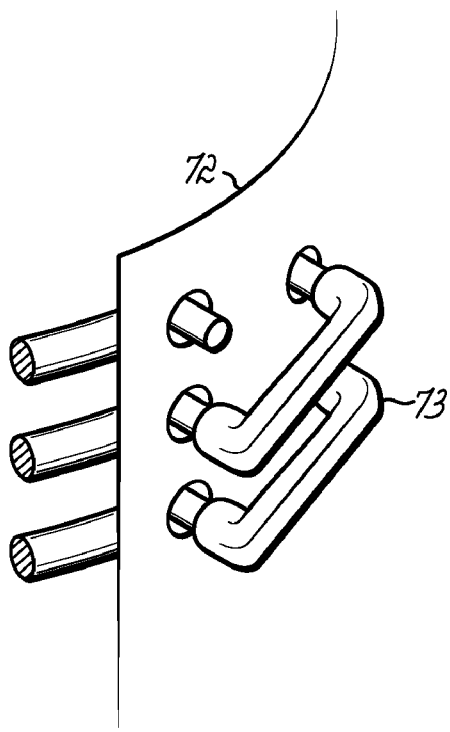
FIG. 9 is a perspective view of a portion of the assembly of FIG. 8 illustrating cross-overs for antennae connected in series, with the cross-overs located behind the chamber shield.

Antenna assembly 10 has been described as a single-turn antenna configuration. The principles of the present invention can be applied to multiple turn antennae also. For example, several antennae or antenna loops can be connected in series. Alternatively, several individual antennae can be assembled in the chamber 12. Antennae can be connected in series through connectors mounted on chamber side-wall 11. FIG. 8 shows a vertically stacked arrangement 70 of antennae 71. A horizontal planar arrangement of antennae (not shown) of increasing diameters is also possible. A series connection between antennae can be accomplished by cross-overs 73 located behind a chamber shield 72, as shown in FIG. 9. The cross-overs may be embedded in a dielectric and shielded in a grounded enclosure to prevent them from striking the plasma (not shown in the Figure).

Figure 10:
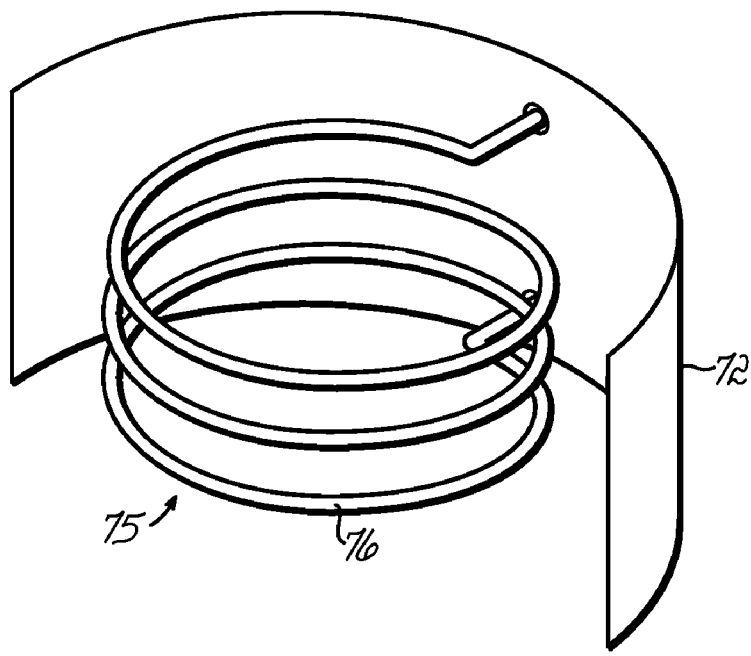
FIG. 10 is a perspective view, similar to FIG. 8, according to an alternative embodiment of the invention, illustrating a vertical spiral antenna.

A spiral antenna assembly 75 may be provided, formed of a single spiral 76. Such an antenna assembly 75 can be mounted on the chamber side-wall 11 in any of a plurality of locations, one of which is illustrated in FIG. 10. A horizontal planar spiral antenna (not shown), which would usually be located near the top or bottom of the chamber 12 (for reasons of support) is also possible.

Figure 11:
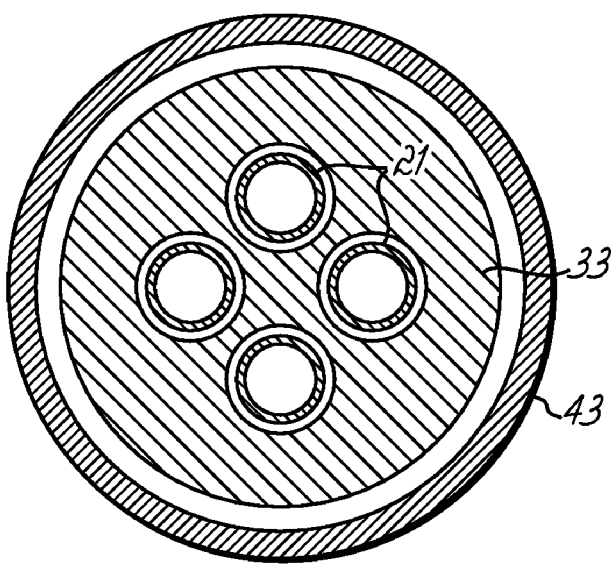
FIG. 11 is a cross section of an antenna, according to certain embodiments of the invention, showing several conductors embedded in a shield and spacer, suitable for configurations including those with conductors connected in series with a cross-over.

Several turns 21 of the conductor 20 can be embedded in a single dielectric shield 33 and enclosed in a single conductive shield 43, as shown in FIG. 11. The individual conductors 21 may then be connected in series. This configuration would have a relatively complex current cross-over, in part at least because of vacuum tight connections between the conductors 21, such that the cross-over would also have to be enclosed in a dielectric and conductive shield.

The advantages of this invention over prior art are mainly a consequence of the conductor being embedded in the plasma, but still protected from the plasma flux. The advantages include shield simplicity, whereby the shield is not above the wafer, and does not require active cooling. Near perfect RF transparency of the shield, compared with the RF transparency of a standard deposition baffle, in which slot end effects short out the current flux going into the chamber. This end effect can be reduced by extending the slots beyond the extent of the coils. With the segmented shield 40, slots are circumferential, and have no ends. Thus there is no shorting effect.

Gas cooling, instead of water cooling for an immersed antennae, simplifies the antenna construction, and connections, since the worst possible accident that could occur with gas cooling is a small gas leak. In addition, since the antenna is enclosed in a plasma, the coupling efficiency is high, and the parasitic inductance due to magnetic flux filling non-plasma space is minimized to that between the conductor 20 and the shield 40.

The invention has been described in the context of exemplary embodiments. Those skilled in the art will appreciate that additions, deletions and modifications to the features described herein may be made without departing from the principles of the present invention. Accordingly, the following is claimed:

The invention claimed is:

1. An antenna assembly for energizing an ICP from a position internal to the vacuum processing chamber of a semiconductor wafer processing apparatus, the antenna comprising:
    a central RF conductor formed into at least one loop;
    a dielectric spacer formed of a plurality of dielectric spacer segments arranged end-to-end along the central conductor, wherein the dielectric spacer is concentric with and surrounding the central RF conductor; and
    a segmented electrically-conductive shield concentric with and surrounding the dielectric spacer, wherein:
        the segmented electrically conductive electrically-conductive shield is formed of a plurality of segments of generally circular cross-section, arranged end-to-end with endless circumferential gaps between adjacent ones of the segments, the gaps being sufficiently narrow to avoid the formation of plasma therein when immersed in a plasma-containing vacuum processing space of the processing apparatus; and
        the dielectric spacer is configured to maintain separation between the central RF conductor and the segmented electrically-conductive shield by occupying at least a portion of the space between the central RF conductor and the segmented electrically-conductive shield and in the gaps between the adjacent ones of the segments.

2. An ICP source comprising the antenna assembly of claim 1 and further comprising:
    an RF power supply;
    leads connecting the RF power supply to the central RF conductor;
    insulators surrounding the leads to insulate the leads from a chamber wall when passing therethrough; and
    dielectric material for isolating the leads from a plasma and enclosing the leads from the insulators to the central RF conductor.

3. A vacuum processing apparatus comprising the ICP source of claim 2 and further comprising:
    a vacuum chamber having the antenna assembly mounted therein;
    the chamber wall enclosing the vacuum chamber and having feed holes therein;
    the RF power supply being mounted outside of the vacuum chamber and the insulators being located at the feed holes of the chamber wall; and
    a substrate support mounted within the vacuum chamber.

4. The vacuum processing apparatus of claim 3 further comprising: a cooling gas supply system coupled to the central RF conductor.

5. The vacuum processing apparatus of claim 3 for processing a wafer therein by IPVD, the apparatus further comprising:
    a sputtering target having a sputtering surface within the processing chamber; and
    a cathode power supply connected to the sputtering target.

6. The antenna assembly of claim 1, wherein the antenna assembly is configured to be capable of being assembled by alternately sliding segments of the dielectric spacer and segments of the electrically-conductive shield over the central RF conductor from an end thereof.

7. The antenna assembly of claim 1 wherein the gaps between adjacent ones of the segments of the dielectric spacer are not more than approximately 2 millimeters wide.

8. The antenna assembly of claim 1 wherein the segments of the dielectric spacer further include gaps between adjacent ones of the segments, the gaps between the segments of the dielectric spacer being staggered with respect to the gaps between the segments of the electrically conductive electrically-conductive shield, the segmented electrically-conductive shield maintaining separation between the segments of the dielectric spacers by occupying at least a portion of a space in the gaps between adjacent segments of the dielectric spacers.

9. The antenna assembly of claim 1, wherein the gaps between adjacent ones of the segments of the electrically-conductive shield are not more than approximately 2 millimeters wide.

10. The antenna assembly of claim 1, wherein the central RF conductor has a cooling gas channel therein, electrical connectors at opposite ends thereof, and cooling gas connectors at said opposite ends, the assembly further comprising:
    at least one multiple piece dielectric shield enclosing one or more of the electrical connectors at one or more ends of the central RF conductor to isolate said one or more of the electrical connectors from a plasma.

11. The antenna assembly of claim 1 wherein the dielectric spacer is formed of a plurality of pieces each configured to partially encircle the central RF conductor and to be closed around the central RF conductor.

12. An ICP processing apparatus comprising the antenna assembly of claim 1 and further comprising:
    a vacuum chamber;
    a chamber wall enclosing the vacuum chamber;
    a substrate support mounted within the vacuum chamber;
    an ICP source including an RF power supply mounted outside of the vacuum chamber and an internal antenna assembly within the vacuum chamber; and
    the antenna assembly having leads connecting the central RF conductor through the chamber wall to the RF power supply.

13. The apparatus of claim 12, wherein the gaps between the segments of the segmented electrically-conductive shield are sufficiently narrow to avoid the formation of a plasma therein.

14. The apparatus of claim 12, wherein the leads connecting the RF power supply to the central RF conductor have dielectric material surrounding the leads within the vacuum chamber, whereby the central RF conductor and the leads thereto are isolated from a plasma formed within the vacuum chamber.

15. The apparatus of claim 12, wherein the dielectric spacer is formed of a plurality of dielectric spacer segments, arranged end-to-end along the central RF conductor.

16. The antenna assembly of claim 1, wherein the dielectric spacer occupies substantially all of the space between the central RF conductor and the segmented electrically-conductive shield and in the gaps between the adjacent ones of the segments.

17. An antenna assembly for energizing an ICP from a position internal to the vacuum processing chamber of a semiconductor wafer processing apparatus, the antenna comprising:

a central RF conductor formed into at least one loop;

a segmented dielectric spacer concentric with and surrounding the central RF conductor; and a segmented electrically-conductive shield concentric with and surrounding the segmented dielectric spacer, wherein:

the segmented electrically-conductive shield is formed of a plurality of segments of generally circular cross-section, arranged end-to-end with endless circumferential gaps between adjacent ones of the segments, the gaps being sufficiently narrow to avoid the formation of plasma therein when immersed in a plasma-containing vacuum processing space of the processing apparatus; and the segmented dielectric spacer is formed of a plurality of segments of generally circular cross-section, arranged end-to-end, the segmented dielectric spacer being configured to be in alternate sliding arrangement with the plurality of segments of the segmented electrically-conductive shield and to maintain a separation between the central RF conductor and the segmented electrically-conductive shield by occupying substantially all the space between the central RF conductor and the segmented electrically-conductive shield and the gaps between adjacent ones of the segments.

* * * * *

UNITED STATES PATENT AND TRADEMARK OFFICE
CERTIFICATE OF CORRECTION

PATENT NO. : 7,591,232 B2
APPLICATION NO. : 11/278167
DATED : September 22, 2009
INVENTOR(S) : Mirko Vukovic It is certified that error appears in the above-identified patent and that said Letters Patent is hereby corrected as shown below:

Title Page, Item (57)
In the Abstract, in the last sentence, "The shield segments arranged end-to-end," should read --The shield segments are arranged end-to-end,--.

In Column 1, line 38, "prior art to IPVD" should read --prior art IPVD--.
In Column 1, lines 47-48, "complicates and the operation" should read --complicates the operation--.
In Column 1, line 57, "with the PF field" should read --with the RF field--.

In Column 4, lines 29-30, "according, to" should read --according to--.
In Column 4, lines 60-61, "as illustrated by" should read --is illustrated by--.
In Column 4, line 66, "acquire little DC" should read --acquires little DC--.

In Column 5, line 28, "shield for assembled" should read --shield for assembly--.
In Column 5, line 36, "with the a clam shell" should read --with a clam shell--.

In Column 6, line 5, "In principal" should read --In principle--.
In Column 6, line 61, "require active cooling. Near perfect RF" should read --require active cooling, and near perfect RF--.

In Claim 1, Column 7, lines 27-28, "electrically conductive electrically-conductive" should read --electrically-conductive--.

Signed and Sealed this

Eleventh Day of May, 2010

David J. Kappos
*Director of the United States Patent and Trademark Office*

UNITED STATES PATENT AND TRADEMARK OFFICE
CERTIFICATE OF CORRECTION

PATENT NO. : 7,591,232 B2 Page 1 of 1
APPLICATION NO. : 11/278167
DATED : September 22, 2009
INVENTOR(S) : Mirko Vukovic It is certified that error appears in the above-identified patent and that said Letters Patent is hereby corrected as shown below:

Title Page, (*) Notice: Subject to any disclaimer, the term of this patent is extended or adjusted under 35 U.S.C. 154(b) by 354 days.

should read (*) Notice: Subject to any disclaimer, the term of this patent is extended or adjusted under 35 U.S.C. 154(b) by 529 days.

Signed and Sealed this

Third Day of August, 2010

David J. Kappos
*Director of the United States Patent and Trademark Office*